United States Patent [19]
Gardner et al.

[11] Patent Number: 5,981,363
[45] Date of Patent: Nov. 9, 1999

[54] METHOD AND APPARATUS FOR HIGH PERFORMANCE TRANSISTOR DEVICES

[76] Inventors: Mark I. Gardner, P.O. Box 249, Cedar Creek, Tex. 78612; H. Jim Fulford, 9808 Woodshire Dr., Austin, Tex. 78748; Charles E. May, 23900 SE. Stark Apt 123, Gresham, Oreg. 97030

[21] Appl. No.: 09/193,447

[22] Filed: Nov. 17, 1998

[51] Int. Cl.⁶ ...................... H01L 21/3205; H01L 21/336
[52] U.S. Cl. .......................... 438/585; 438/299; 438/305; 438/947; 438/481
[58] Field of Search ..................................... 438/585, 595, 438/299, 301, 303, 305, 306, 307, 481, 488, 947

[56] References Cited

U.S. PATENT DOCUMENTS

| | | | |
|---|---|---|---|
| 4,061,530 | 12/1977 | Hosack | 438/947 |
| 4,083,098 | 4/1978 | Nicholas | 438/587 |
| 4,312,680 | 1/1982 | Hsu | 438/947 |
| 4,313,782 | 2/1982 | Sokoloski | 438/947 |
| 4,354,896 | 10/1982 | Hunter et al. | 438/587 |
| 4,445,267 | 5/1984 | De La Moneda et al. | 437/301 |
| 4,999,314 | 3/1991 | Pribat et al. | 438/481 |

*Primary Examiner*—Michael Trinh

[57] ABSTRACT

The present invention is directed to a method for forming a semiconductor device having a reduced channel length. The method comprises forming a layer of a dielectric material above a surface of a semiconducting substrate, and forming a layer of polysilicon above the layer of dielectric material. The method further comprises forming a layer of silicon nitride or silicon oxynitride above the layer of polysilicon, and patterning said layer of polysilicon and layer of silicon nitride or silicon oxynitride to define an opening and expose a sidewall surface of the polysilicon layer. The method continues with the growth of a lateral extension of the polysilicon layer and the oxidation of the extension. The method concludes with the patterning of the polysilicon layer to define a gate conductor, and the formation of source and drain regions in the substrate.

38 Claims, 4 Drawing Sheets

METHOD AND APPARATUS FOR HIGH PERFORMANCE TRANSISTOR DEVICES

BACKGROUND OF THE INVENTION

1. Field of the Invention

The present invention is generally directed to the field of semiconductor processing, and, more particularly, to a method for making a high performance transistor having a very short channel length.

2. Description of the Related Art

There is a constant drive within the semiconductor industry to increase the operating speed of integrated circuit devices, e.g., microprocessors, memory devices, etc. This drive is fueled by consumer demands for computers and electronic devices that operate at increasingly greater speeds. Integrated circuit devices are comprised of, among other things, many thousands of transistors. The speed at which these integrated circuit devices operate may be determined, in part, by the channel length of the transistor device and/or the thickness of the gate dielectric layer. All other things being equal, the smaller the channel length of the transistor, or the thinner the gate dielectric, the faster the transistor will operate. Thus, there is a constant drive to reduce the channel length of transistors to increase the overall speed of the transistor, as well as integrated circuit devices incorporating such transistors.

The ability to reduce the channel length, or feature size, of modern transistors is presently limited by modern photolithography equipment and techniques. Traditionally, components of a transistor, such as the gate conductor and gate dielectric, are made by forming the appropriate process layers, e.g., silicon dioxide and polysilicon, above the surface of a semiconducting substrate, forming a layer of photoresist above the layer of polysilicon, developing and patterning the layer of photoresist to define a mask that covers what will become the gate conductor and gate oxide, and removing the portions of the polysilicon and silicon dioxide layers that extend beyond the mask through one or more etching steps.

Using the traditional photolithography techniques described above, the feature size, e.g., the width of the gate conductor, which corresponds to the channel length of the transistor, is a result of directly forming the feature size in a layer of photoresist, or other similar masking layer, above the semiconducting substrate. To achieve further reduction in the feature size of transistors, e.g., the channel length, it is necessary to develop an alternative method that will allow formation of transistors with feature sizes smaller than that achievable with current photolithography techniques.

The present invention is directed to a semiconductor device that minimizes or reduces some or all of the aforementioned problems and a method of making same.

SUMMARY OF THE INVENTION

The present invention is directed to a method for making a semiconductor device having a very short channel length. The method is comprised of forming a first process layer comprised of a dielectric material above the surface of a semiconducting substrate, forming a second process layer comprised of polysilicon above the first process layer, and forming a third process layer above the second process layer. The method further comprises pattering the second and third process layers to define an opening and thereby expose a sidewall surface of the second process layer. The method also includes the process of growing a lateral extension of the second process layer at least partially into the opening. An oxidation process is then performed to form a layer of silicon dioxide on the exposed portion of the lateral extensions. Thereafter, the second process layer is patterned to define a gate conductor, and a plurality of source/drain regions are formed in the substrate.

BRIEF DESCRIPTION OF THE DRAWINGS

The invention may be understood by reference to the following description taken in conjunction with the accompanying drawings, in which like reference numerals identify like elements, and in which.

Figure 1:
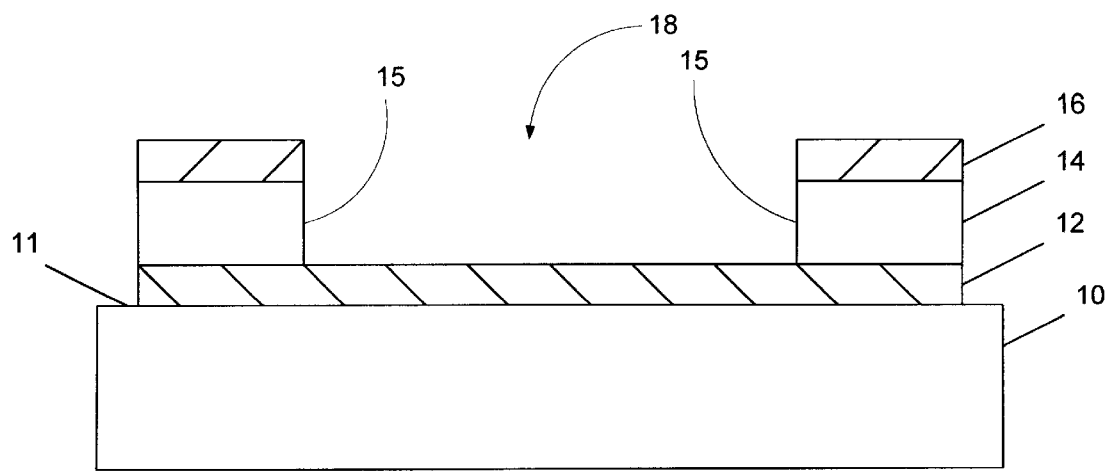
FIG. 1 is a cross-sectional view of an illustrative semiconducting substrate with a plurality of process layers formed above the substrate and an opening formed therein.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–7. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a high performance semiconductor device having reduced feature sizes and a method for making same. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

As shown in FIG. 1, a process layer 12 is formed above a surface 11 of a semiconducting substrate 10. Thereafter, process layers 14 and 16 are formed above the process layer 12, and an opening 18 is formed in the process layers 14, 16 by traditional photolithographic and etching processes. This process of defining the opening 18 results in the exposure of sidewall surfaces 15 of the process layer 14.

In one illustrative embodiment, the semiconducting substrate 10 is comprised of silicon. The process layer 12 may be comprised of a variety of dielectric materials. For example, the process layer 12 may be comprised of silicon dioxide, silicon nitride, tantalum pentoxide, barium strontium titanate, or other dielectric materials having a dielectric constant greater than approximately 8. The thickness of the process layer 12 may be varied as a matter of design choice, and may range from approximately 25–100 Å in thickness. The process layer 12 may be formed by any of a variety of techniques for forming such layers, including chemical vapor deposition (CVD), sputtering, low pressure chemical vapor deposition (LPCVD), plasma deposition, etc.

The process layer 14 may be comprised of a variety of materials, such as, for example, polysilicon, and may have a thickness ranging from approximately 1000–2000 Å. The process layer 14 may be formed by a variety of processes known to those skilled in the art for forming such layers, including, but not limited to, LPCVD, CVD, etc. The process layer 16 may be comprised of a variety of materials, including, but not limited to, silicon nitride, silicon oxynitride, or like materials. As will be understood by those skilled in the art after a complete reading of the present disclosure, the process layer 16 may be made of a variety of materials that are selectively etchable with respect to silicon dioxide. The process layer 16 may be formed by any of a variety of known techniques for forming such layers, including, but not limited to, LPCVD, plasma deposition, sputtering, etc., and may have a thickness ranging from approximately 100–500 Å.

The opening 18 may be formed by one or more known etching processes in which portions of the process layers 16 and 14 are removed as shown in FIG. 1. In one embodiment where the process layer 14 is comprised of polysilicon, and the process layer 16 is comprised of silicon nitride, the opening 18 may be formed by multiple etching processes performed in situ, in a single etching chamber. This in situ etching process may be performed by changing the appropriate gas chemistries once etching of the top layer, i.e., process layer 16, is accomplished. In one embodiment, where the process layer 16 is comprised of silicon nitride, the etchant gas may be comprised of, for example, $Cl_2$ and helium. Another etch chemistry, such as a chemistry involving hydrogen bromide (HBr), may be used to etch the process layer 14 comprised of polysilicon.

Figure 2:
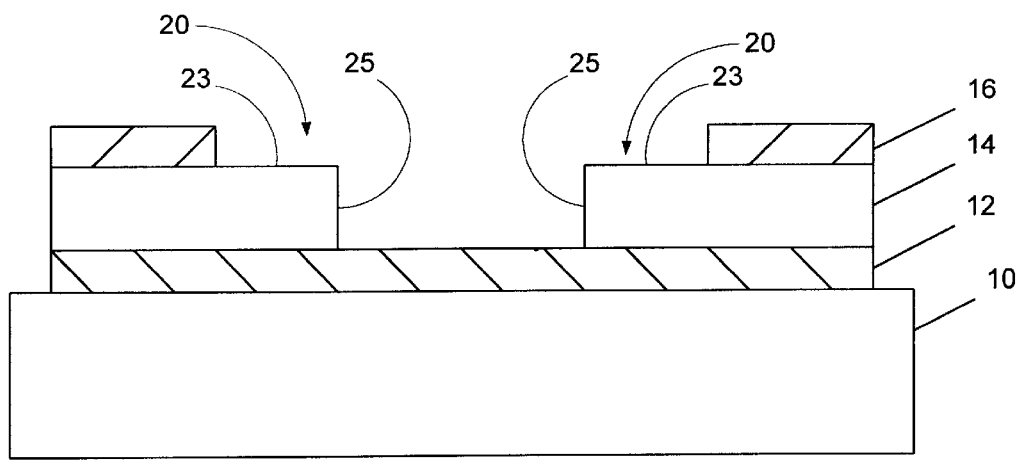
FIG. 2 is a cross-sectional view of the device shown in FIG. 1 after it has been subjected to a heat treating process.

Next, as shown in FIG. 2, a heat treating process is performed to grow lateral extensions 20 from the process layer 14 such that the extensions 20 extend into the opening 18. These lateral extensions 20 have a top surface 23 and a sidewall 25. This heat treating process may be performed by a variety of known techniques and methods. In one illustrative embodiment, this heat treating process is performed by a rapid thermal anneal (RTA) process at a temperature ranging from approximately 800–1075° C. for approximately 30 seconds to 3 minutes. This heat treating process is carried out in the presence of, for example, silane ($SiH_4$) or dichlorosilane ($SiCl_2H_2$), or like materials. Additionally, this heat treating process may also be performed in a tube furnace at a similar temperature for a time period ranging between 5–15 minutes. Of course, the amount of time that the heat treating process is carried out will depend, in part, upon the amount of the desired growth of the extension 20. All other things being equal, to grow the lateral extensions 20 to a greater length requires performing the heat treating process for a longer period of time.

As will be apparent to those skilled in the art upon a reading of the complete disclosure herein, each of the lateral extensions 20 will become the gate conductor for a transistor fabricated in accordance with the present invention. Thus, the width of the extension 20 (measured parallel to the surface 11 of the substrate 10) will roughly correspond to the channel length of the finished transistor. Using the techniques disclosed herein, transistors having a feature size, e.g., a gate width, ranging from approximately 200–500 Å, may be formed. Additionally, since the lateral extensions 20 will ultimately constitute the gate conductor of a transistor, if desired, dopant atoms can be added during the growth of the lateral extensions 20. For example, in the case of NMOS technology, arsine may be added during the growth of the lateral extensions 20. Similarly, for PMOS type devices, boron may be added during the time when the lateral extensions 20 are grown.

Figure 3:
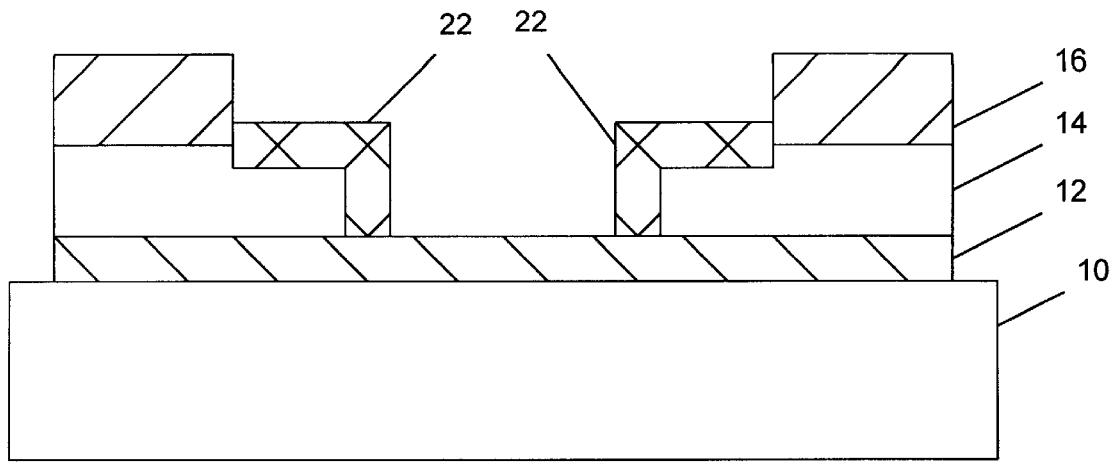
FIG. 3 is a cross-sectional view of the structure shown in FIG. 2 after it has been subjected to an oxidation process.

Thereafter, as shown in FIG. 3, the structure is subjected to an oxidation process. The result of this oxidation process is the formation of an oxide layer 22 on the top surface 23 (see FIG. 3) and sidewall surface 25 (see FIG. 3) of the lateral extensions 20. Of course, portions of the lateral extension 20 are consumed in the oxidation process. The thickness of the oxide layer 22 may be varied as a matter of design choice. In one illustrative embodiment, the oxide layer 22 may have a thickness ranging from approximately 25–75 Å. This oxidation process may be carried out by a variety of known techniques. In one illustrative embodiment, the oxidation process is comprised of a rapid thermal anneal process performed at a temperature ranging from approximately 700–900° C. for a time of 30–90 seconds. This process could also be performed in a traditional tube furnace at the same approximate temperatures for a time period ranging from approximately 5–10 minutes.

Figure 4:
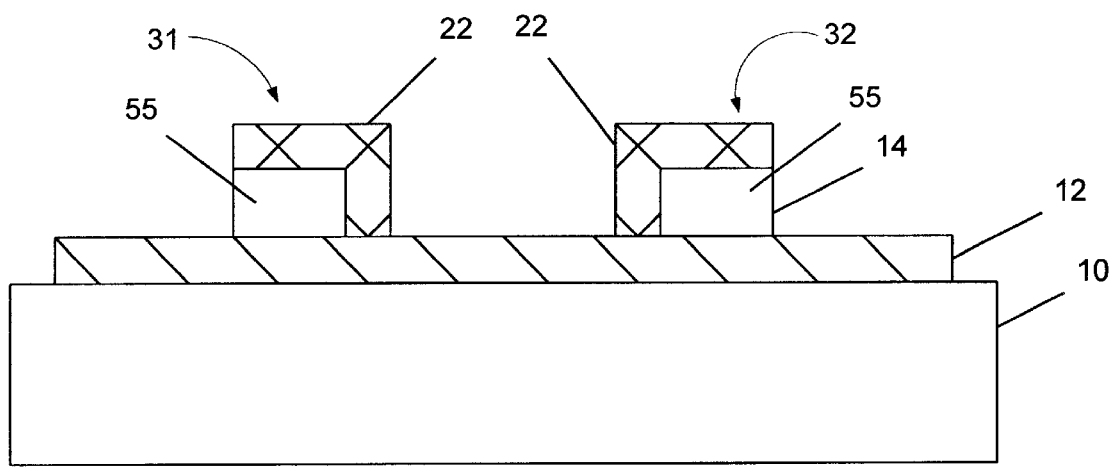
FIG. 4 is a cross-sectional view of the structure shown in FIG. 3 after it has been subjected to an etching process.

Next, as shown in FIG. 4, the structure in FIG. 3 is subjected to one or more etching processes to remove the process layer 16, and portions of the process layer 14 that are not protected by the oxide layer 22. This etching results in the formation of two stacks 31, 32, each comprised of a gate conductor 55. These etching processes may be carried out in one or multiple steps, and may be performed in situ in a single etching chamber with, of course, the appropriate change of etchant gas chemistries. Note that this process is typically an anisotropic etching process. With additional processing steps (described more fully below), each of the stacks 31, 32 may ultimately be formed into a single transistor, or they may be combined as a series of chained transistors sharing a common source and/or drain. For purposes of clarity, the additional processing required to form a single transistor will be discussed with respect to structure 31 only.

Figure 5:
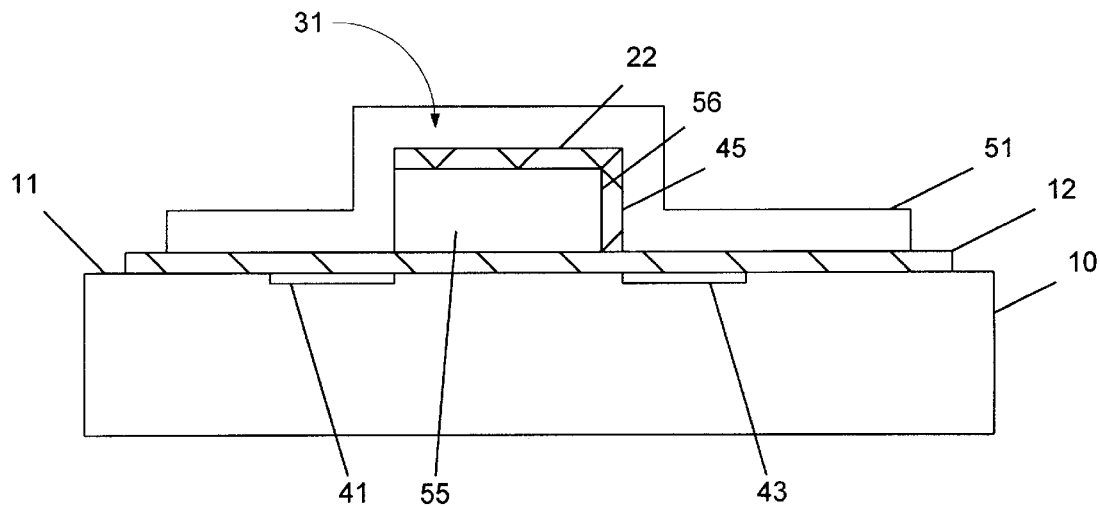
FIG. 5 is a cross-sectional view of an illustrative transistor in the process of being made in accordance with the present invention.

As shown in FIG. 5, the stack 31 is enlarged for purposes of clarity. Initially, the device is subjected to an initial, light doping implantation process for purposes of forming regions 41, 43 adjacent the structure 31. Note that the region 43 is spaced laterally away from an edge 56 of the gate conductor 55 by an amount that corresponds to the horizontal width of the vertical portion 45 of the oxide layer 22. If desired, a thermal heat treatment may be performed after the initial implant step to, in effect, drive the region 43 toward the gate conductor 55. In one embodiment, this may be performed by an RTA process at a temperature ranging from approximately 900–1000° C. for a time of approximately 10–30 seconds. Those skilled in the art will recognize that portions of the regions 41, 43 nearest the stack 31 will become the extensions of source and drain regions having a traditional lightly-doped drain (LDD) structure. Of course, such LDD structures are not required to practice the present invention. In one illustrative embodiment, the initial implantation process may be performed at an energy level of 5–40 keV and at a concentration of $6 \times 10^{14}$–$5 \times 10^{15}$ ions/cm$^2$ of the appropriate dopant atoms, e.g., arsenic (for NMOS) or boron (for PMOS).

Figure 6:
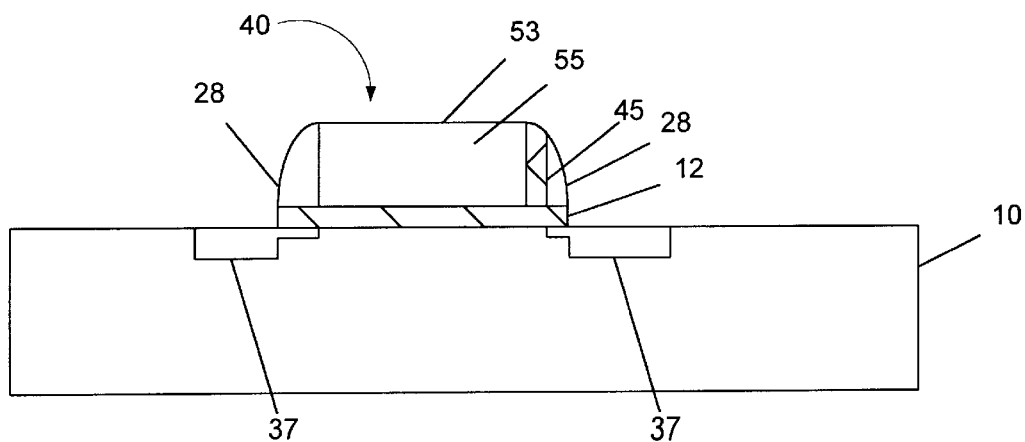
FIG. 6 is a cross-sectional view of the device shown in FIG. 5 after sidewall spacers have been formed adjacent the gate conductor and source/drain regions have been formed in the substrate.

Thereafter, a plurality of sidewall spacers 28 are formed adjacent the stack 31, as shown in FIG. 6. The formation of the sidewall spacers 28 will be described with reference to FIGS. 5 and 6. The sidewall spacers 28 may be made from a variety of materials, for example, silicon nitride, silicon oxynitride, or like materials. The sidewall spacers 28 may be made by forming a layer 51 (see FIG. 5) of spacer material above the stack 31, and, thereafter, performing an anisotropic etch process. Note that, during the etching process, the portion of the oxide layer 22 above the surface 53 of the gate conductor 55, as well as the portions of the process layer 12 lying beyond the sidewall spacers 28, are also removed. Additionally, a portion of the section 45 of the oxide layer 22 also remains, and, in effect, becomes part of the sidewall spacer 28. The resulting sidewall spacers 28 (see FIG. 6) may have a thickness ranging between approximately 100–600 Å as measured at the point where the sidewall spacers 28 intersect the process layer 12.

Thereafter, the device is subjected to a further ion implantation process at an energy level of, for example, 2–15 keV, and at a concentration ranging between approximately 2–9× $10^{15}$ ions/cm$^2$ of the appropriate dopant material, e.g., arsenic or boron. This results in the formation of source/drain regions 37 having the familiar lightly doped drain structure. As described previously, the doping of the gate conductor 55 may be accomplished during the growth of the lateral extensions 20. Alternatively, the gate conductor 55 may be doped only during the above-described implantation processes. As will be readily apparent to one skilled in the art, the transistor 40 may thereafter be subjected to a salicidation process to improve the conductivity of the gate conductor 20, as well as the source and drain regions 37.

Figure 7:
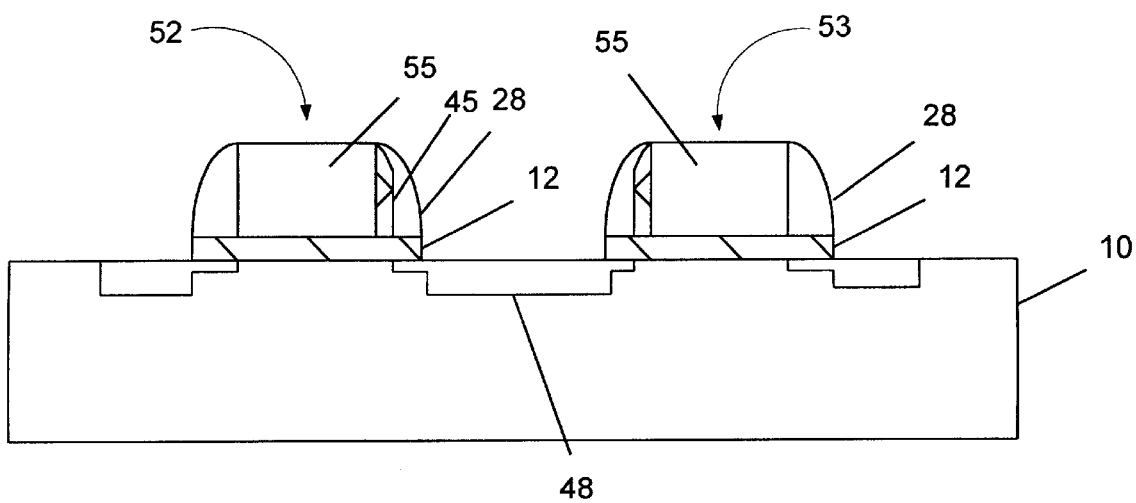
FIG. 7 is a cross-sectional view of an illustrative embodiment of a chained transistor made in accordance with the present invention.

The present invention may also be used to form chained semiconductor devices 52, 53 that share a common drain 48, as shown in FIG. 7. This would be accomplished by starting with the basic structure depicted in FIG. 4, and, thereafter, using the same process steps outlined above with respect to a single transistor formation, i.e., initial light-doping implantation process, followed by formation of sidewall spacers, followed by a subsequent heavy-doping implantation process.

Through use of the present invention, a high performance semiconductor device may be formed having a reduced feature size and increased performance. In particular, through use of the present invention, a semiconductor device may be formed having a channel length ranging from 200–500 Å.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor, comprising:

forming a first process layer comprised of a dielectric material above a surface of a semiconducting substrate;

forming a second process layer comprised of polysilicon above said first process layer;

forming a third process layer above said second process layer;

patterning said second and third process layers to define an opening and expose a sidewall surface of said second process layer;

growing a lateral extension of said second process layer at least partially into said opening;

forming a layer of silicon dioxide on said lateral extension;

patterning said second process layer to define a gate conductor; and forming a plurality of source/drain regions in said substrate.

2. The method of claim 1, wherein forming a first process layer comprised of a dielectric material above a surface of a semiconducting substrate comprises forming a first process layer comprised of silicon dioxide.

3. The method of claim 1, wherein forming a first process layer comprised of a dielectric material above a surface of a semiconducting substrate comprises forming a first process layer comprised of a dielectric material having a dielectric constant greater than approximately 8 above a surface of a semiconducting substrate.

4. The method of claim 1, wherein forming a first process layer comprised of a dielectric material above a surface of a semiconducting substrate comprises forming a first process layer comprised of silicon nitride, tantalum pentoxide, or barium strontium titanate above a surface of a semiconducting substrate.

5. The method of claim 1, wherein forming a second process layer comprised of polysilicon above said first process layer comprises depositing a second process layer comprised of polysilicon above said first process layer.

6. The method of claim 1, wherein forming a third process layer above said second process layer comprises forming a third process layer comprised of silicon nitride or silicon oxynitride above said second process layer.

7. The method of claim 1, wherein forming a third process layer above said second process layer comprises forming a third process layer comprised of a material that may be selectively etched with respect to silicon dioxide above said second process layer.

8. The method of claim 1, wherein growing a lateral extension of said second process layer comprises thermally growing a lateral extension of said second process layer at a temperature ranging from approximately 800–1075° C.

9. The method of claim 1, wherein forming a layer of silicon dioxide on said lateral extension comprises oxidizing a portion of said lateral extension.

10. The method of claim 1, wherein forming a layer of silicon dioxide on said lateral extension comprises performing a heat treating process at a temperature ranging from approximately 700–900° C. in the presence of oxygen.

11. The method of claim 1, wherein patterning said second process layer to define a gate conductor comprises etching said second process layer to define a gate conductor.

12. The method of claim 1, wherein forming a plurality of source/drain regions in said substrate comprises performing multiple ion implantation processes to form source and drain regions in said substrate.

13. The method of claim 1, further comprising forming a plurality of sidewall spacers adjacent said gate conductor.

14. A method of forming a transistor, comprising:
   forming a first process layer comprised of a dielectric material above a surface of a semiconducting substrate;
   forming a second process layer comprised of polysilicon above said first process layer;
   forming a third process layer comprised of silicon nitride above said second process layer;
   etching said second and third process layers to define an opening and expose a sidewall surface of said second process layer;
   thermally growing a lateral extension of said second process layer at least partially into said opening, said growing performed at a temperature ranging from approximately 800–1075° C.;
   oxidizing at least a portion of said lateral extension to form a layer of silicon dioxide thereon, said oxidation process being performed at a temperature ranging from approximately 700–900° C. in the presence of oxygen;
   etching said second process layer to define a gate conductor; and
   forming a plurality of source/drain regions in said substrate.

15. The method of claim 14, wherein forming a first process layer comprised of a dielectric material above a surface of a semiconducting substrate comprises forming a first process layer comprised of silicon dioxide.

16. The method of claim 14, wherein forming a first process layer comprised of a dielectric material above a surface of a semiconducting substrate comprises forming a first process layer comprised of a dielectric material having a dielectric constant greater than approximately 8 above a surface of a semiconducting substrate.

17. The method of claim 14, wherein forming a first process layer comprised of a dielectric material above a surface of a semiconducting substrate comprises forming a first process layer comprised of silicon nitride, tantalum pentoxide, or barium strontium titanate above a surface of a semiconducting substrate.

18. The method of claim 14, wherein forming a second process layer comprised of polysilicon above said first process layer comprises depositing a second process layer comprised of polysilicon above said first process layer.

19. The method of claim 14, wherein forming a third process layer above said second process layer comprises forming a third process layer comprised of silicon nitride or silicon oxynitride above said second process layer.

20. The method of claim 14, wherein forming a third process layer above said second process layer comprises forming a third process layer comprised of a material that may be selectively etched with respect to silicon dioxide above said second process layer.

21. The method of claim 14, wherein forming a plurality of source/drain regions in said substrate comprises performing multiple ion implantation processes to form source and drain regions in said substrate.

22. The method of claim 14, further comprising forming a plurality of sidewall spacers adjacent said gate conductor.

23. A method of forming a transistor, comprising:
   depositing a first process layer comprised of a dielectric material having a dielectric constant greater than approximately 8 above a surface of a semiconducting substrate;
   depositing a second process layer comprised of polysilicon above said first process layer;
   depositing a third process layer comprised of silicon nitride above said second process layer;
   etching said second and third process layers to define an opening and expose a sidewall surface of said second process layer;
   thermally growing a lateral extension of said second process layer at least partially into said opening, said growing performed at a temperature ranging from approximately 800–1075° C.;
   forming a layer of silicon dioxide on said lateral extension by performing a heat treating process at a temperature ranging from approximately 700–900° C. in the presence of oxygen;
   etching said second process layer to define a gate conductor; and
   forming a plurality of source/drain regions in said substrate.

24. The method of claim 23, wherein forming a plurality of source/drain regions in said substrate comprises performing multiple ion implantation processes to form source and drain regions in said substrate.

25. The method of claim 23, further comprising forming a plurality of sidewall spacers adjacent said gate conductor.

26. A method of forming a plurality of chained transistors, comprising:
   forming a first process layer comprised of a dielectric material above a surface of a semiconducting substrate;
   forming a second process layer comprised of polysilicon above said first process layer;
   forming a third process layer above said second process layer;
   patterning said second and third process layers to define an opening and expose a plurality of sidewall surfaces of said second process layer;
   growing a plurality of lateral extensions of said second process layer, said lateral extensions extending at least partially into said opening;
   forming a layer of silicon dioxide on said plurality of lateral extensions;
   patterning said second process layer to define at least two gate conductors; and
   forming a plurality of source/drain regions in said substrate, at least one of said source/drain regions being positioned between said gate conductors to act as a shared source/drain region for transistors comprised of said gate conductors.

27. The method of claim 26, wherein forming a first process layer comprised of a dielectric material above a surface of a semiconducting substrate comprises forming a first process layer comprised of silicon dioxide.

28. The method of claim 26, wherein forming a first process layer comprised of a dielectric material above a surface of a semiconducting substrate comprises forming a first process layer comprised of a dielectric material having a dielectric constant greater than approximately 8 above a surface of a semiconducting substrate.

29. The method of claim 26, wherein forming a first process layer comprised of a dielectric material above a surface of a semiconducting substrate comprises forming a first process layer comprised of silicon nitride, tantalum pentoxide, or barium strontium titanate above a surface of a semiconducting substrate.

30. The method of claim 26, wherein forming a second process layer comprised of polysilicon above said first process layer comprises depositing a second process layer comprised of polysilicon above said first process layer.

31. The method of claim 26, wherein forming a third process layer above said second process layer comprises forming a third process layer comprised of silicon nitride or silicon oxynitride above said second process layer.

32. The method of claim 26, wherein forming a third process layer above said second process layer comprises forming a third process layer comprised of a material that may be selectively etched with respect to silicon dioxide above said second process layer.

33. The method of claim 26, wherein growing a plurality of lateral extensions of said second process layer comprises thermally growing a plurality of lateral extensions of said second process layer at a temperature ranging from approximately 800–1075° C.

34. The method of claim 26, wherein forming a layer of silicon dioxide on said plurality of lateral extensions comprises oxidizing a portion of said lateral extensions.

35. The method of claim 26, wherein forming a layer of silicon dioxide on said plurality of lateral extensions comprises performing a heat treating process at a temperature ranging from approximately 700–900° C. in the presence of oxygen.

36. The method of claim 26, wherein patterning said second process layer to define at least two gate conductors comprises etching said second process layer to define at least two gate conductors.

37. The method of claim 26, wherein forming a plurality of source/drain regions in said substrate comprises performing multiple ion implantation processes to form a plurality of source and drain regions in said substrate.

38. The method of claim 26, further comprising forming a plurality of sidewall spacers adjacent each of said gate conductors.

* * * * *